(12) United States Patent
Reniers

(10) Patent No.: US 6,661,674 B2
(45) Date of Patent: Dec. 9, 2003

(54) SYSTEM COMPRISING AT LEAST TWO PRINTED CIRCUIT BOARDS

(75) Inventor: Johannes Franciscus Adrianus Reniers, Oss (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/915,682

(22) Filed: Jul. 26, 2001

(65) Prior Publication Data

US 2002/0015290 A1 Feb. 7, 2002

(30) Foreign Application Priority Data

Jul. 31, 2000 (EP) .............................. 00202702

(51) Int. Cl.[7] .............................. H05K 1/14
(52) U.S. Cl. .............. 361/784; 361/743; 361/803; 439/83
(58) Field of Search ............. 361/784, 803, 361/736, 737, 743–745; 439/65, 68, 70, 72, 82, 83

(56) References Cited

U.S. PATENT DOCUMENTS

| 3,105,869 A | * | 10/1963 | Branch et al. .............. 361/803 |
| 3,934,334 A | * | 1/1976 | Hanni ........................ 174/254 |
| 4,074,419 A | * | 2/1978 | Hanni et al. ................ 174/253 |
| 4,109,298 A | * | 8/1978 | Hanni et al. ................ 174/261 |
| 4,787,853 A | * | 11/1988 | Igarashi ....................... 439/55 |
| 4,912,604 A | * | 3/1990 | Vaisanen ..................... 361/818 |
| 5,450,289 A | * | 9/1995 | Kweon et al. ............... 361/773 |
| 5,907,475 A | * | 5/1999 | Babinski et al. ............. 361/719 |
| 5,926,375 A | * | 7/1999 | Watanabe et al. ........... 361/760 |

FOREIGN PATENT DOCUMENTS

| DE | 19636335 | 8/1996 | .......... H01R/23/70 |
| JP | 59-121993 A | * 7/1984 | |
| JP | 01-270390 A | * 10/1989 | |

* cited by examiner

Primary Examiner—John B. Vigushin

(57) ABSTRACT

In a system having two printed circuit boards, each printed circuit board is provided with at least one electrical contact element for electrically interconnecting the printed circuit boards. One of the electrical contact elements includes at least one electroconductive pin formed from one of the printed circuit boards, while the other electrical contact element is formed by at least one recess in the other printed circuit board, a wall of the recess being covered with an electrically conducting layer.

8 Claims, 1 Drawing Sheet

SYSTEM COMPRISING AT LEAST TWO PRINTED CIRCUIT BOARDS

BACKGROUND OF THE INVENTION

1. Field of the Invention

The invention relates to a system having at least two printed circuit boards on which printed circuits are provided, the printed circuit boards each having electrical contact elements for electrically interconnecting the printed circuit boards.

2. Description of the Related Art

A German patent specification No. 196 36 335 (Siemens AG) discloses a daughterboard secured at right angles onto a so-called motherboard using a separate connector, for which purpose the daughterboard is arranged in a slot of the connector and the whole is subsequently connected to the motherboard. On both flat sides of the board, the daughterboard has various contact elements in the form of a number of spaced apart metal contact strips which, in the mounted state of the daughterboard, electroconductively contact the corresponding contact elements of the connector which are situated on either side of the slot. The whole of the daughterboard and the connector is subsequently electroconductively connected to the motherboard by soldering connection contacts of the connector to contact elements of the motherboard. In this manner, the printed circuits of both printed circuit boards are electrically interconnected.

A drawback of the system known from the above-mentioned German patent publication resides in that the electric connection between the daughterboard and the connector on the one hand and the electric connection of the daughterboard and the connector with the motherboard on the other hand is found to be too weak in practice. This can be attributed to the fact that the electric contact between the above-mentioned metal contact strips and the contact elements of the connector can be readily interrupted due to, for example, shifting of the daughterboard, while the solder contacts with the motherboard can readily become detached when the whole is subjected to a mechanical load.

SUMMARY OF THE INVENTION

It is an object of the invention to improve the system in accordance with the prior art in such a manner that a reliable electric connection between the printed circuit boards is attained; to achieve this, a system in accordance with the invention wherein electrical contact elements of one printed circuit board are formed by a number of electroconductive pins manufactured so as to be in one piece with the printed circuit board, and in that the electrical contact elements of the other printed circuit board are formed by a number of recesses having an electroconductive inner surface formed in the other printed circuit board, the pins entering the corresponding recesses and being secured therein by soldering. Preferably, the motherboard and the daughterboard are mounted so as to be mutually perpendicular. The electrical conduction of the pins and the respective recesses is attained by omnilaterally providing the pins, at the outer surface, and the recesses, at the inner surface, with an electroconductive material which preferably includes metal. The system of the present invention has the particular advantage that a separate connector providing for a reliable connection between the printed circuit boards is not required.

In a preferred embodiment of a system in accordance with the invention, the electroconductive material is provided on the outside surface of the pins and on the inside surface of the recesses by an electrolysis.

In a further preferred embodiment of a system in accordance with the invention, the thickness of the electroconductive material ranges between 25 $\mu$m and 40 $\mu$m, and is in particular approximately 35 $\mu$m.

In a further preferred embodiment of a system in accordance with the invention, the electroconductive pin has a diameter below 3 mm, in particular below 2 mm, and more in particular below 1.5 mm.

The invention also relates to a method of manufacturing printed circuit boards which are part of a system in accordance with the invention, wherein the electroconductive pins are formed by material removal, in particular milling or drilling, from one printed circuit board. Preferably, adjoining electroconductive pins of one printed circuit board are electrically insulated with respect to each other by removing intermediate material from said printed circuit board, in particular by milling or drilling.

These and other aspects of the invention will be apparent from and elucidated with reference to the embodiment(s) described hereinafter.

DETAILED DESCRIPTION OF THE PREFERRED EMBODIMENT

Figure 1:
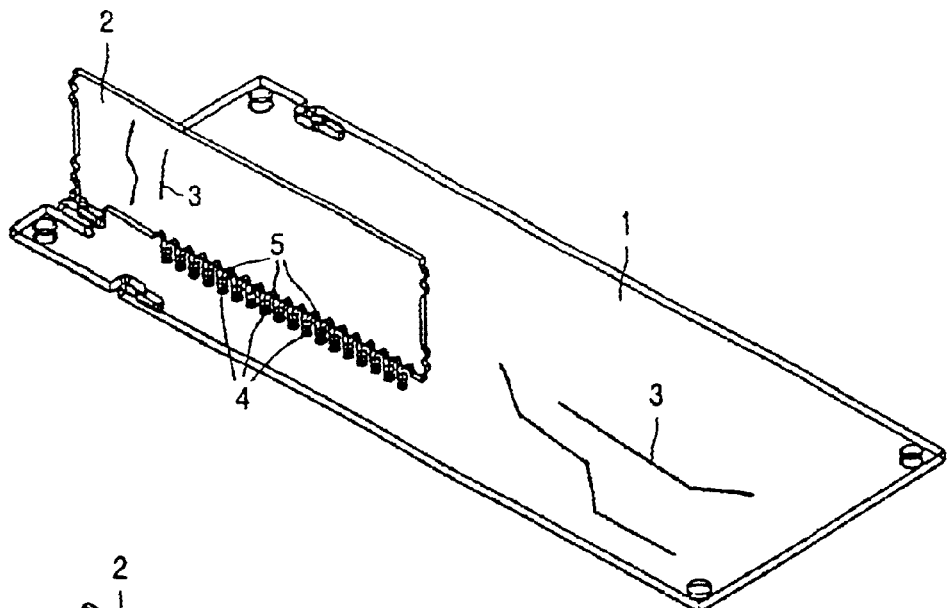
FIG. 1 is a diagrammatic perspective view of a motherboard and a daughterboard in accordance with a preferred modification of the invention.
Figure 3:
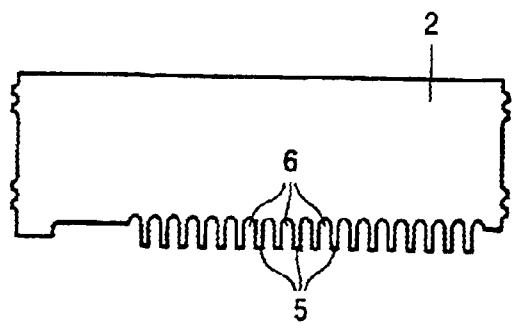
FIG. 3 shows a side view of the daughterboard of FIG. 1.

FIG. 1 shows a motherboard 1 and a daughterboard 2 provided with printed circuits whose copper strips are referenced 3. The motherboard 1 comprises, in this case, eighteen drilled round recesses 4 whose inner surfaces are metallized. The daughterboard 2 comprises eighteen metallized pins 5 of square cross-section which correspond to the round recesses 4. The pins 5 are milled from the daughterboard 2 and hence are in one piece with said daughterboard. In order to preclude electroconductive contact between adjoining pins 5 caused by metal tracks in regions of the daughterboard 2 situated between adjoining pins 5, these regions are milled off in the form of a semi-circular arch referenced 6 as illustrated in FIG. 3. The above-mentioned verb "to metallize" and its conjugations, is to be taken to mean in this connection that the entire inner surface of the recesses 4 and the entire outside of the pins 5 are clad with a preferably 35 $\mu$m thick metal layer.

Figure 2:
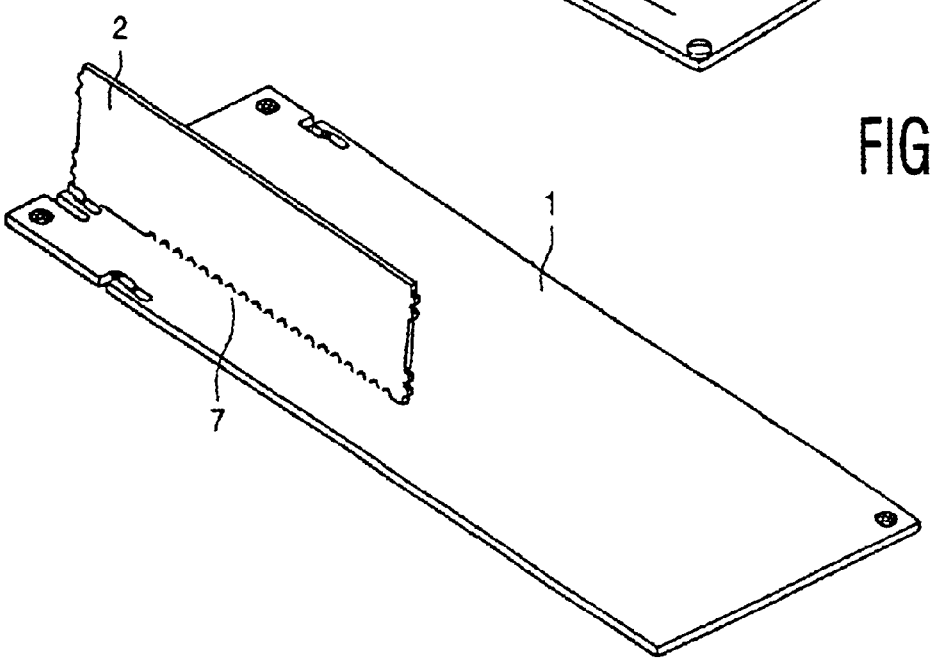
FIG. 2 shows the printed circuit boards shown in FIG. 1 in the operating state.

FIG. 2 shows the printed circuit boards 1, 2 of FIG. 1 in the mounted state, solder 7 being provided between the recesses 4 and the corresponding pins 5 in order to make sure that the assembly is reliably mounted.

The invention is not limited to the embodiment shown in the drawings, but also comprises other variants within the scope of the annexed claims.

I claim:

1. A system, comprising:
   at least two printed circuit boards on which printed circuits are provided, said printed circuit boards each including electrical contact elements for electrically interconnecting the printed circuit boards,
   wherein the electrical contact elements of one printed circuit board are formed by a number of electroconductive pins manufactured so as to be in one piece with said printed circuit board, and in that the electrical contact elements of the other printed circuit board are formed by a number of recesses having an electroconductive inner surface formed in said other printed circuit board, the pins entering the corresponding recesses and being secured therein by soldering.

2. The system as claimed in claim 1, wherein the electroconductive pins are coated on all sides with an electroconductive material.

3. The system as claimed in claim 2, wherein the thickness of the electroconductive material ranges between 25 µm and 40 µm.

4. The system as claimed in claim 1, wherein the inner surface of the recesses is coated on all sides with an electroconductive material.

5. The system as claimed in claim 1, wherein the electroconductive pins have a diameter below 3 mm.

6. The system as claimed in claim 1, wherein the thickness of the electroconductive material approximates 35 µm.

7. The system as claimed in claim 1, wherein the electroconductive pins have a diameter below 2 mm.

8. The system as claimed in claim 1, wherein the electroconductive pins have a diameter below 1.5 mm.

* * * * *